United States Patent
Yamamoto et al.

(10) Patent No.: US 6,762,496 B2
(45) Date of Patent: Jul. 13, 2004

(54) SUBSTRATE AND PRODUCTION METHOD THEREFOR

(75) Inventors: Reo Yamamoto, Tokuyama (JP); Yoshihide Kamiyama, Tokuyama (JP); Yuichiro Minabe, Tokuyama (JP)

(73) Assignee: Tokuyama Corporation, Yamaguchi (JP)

(*) Notice: Subject to any disclaimer, the term of this patent is extended or adjusted under 35 U.S.C. 154(b) by 0 days.

(21) Appl. No.: 10/182,366

(22) PCT Filed: Nov. 28, 2001

(86) PCT No.: PCT/JP01/10378
§ 371 (c)(1),
(2), (4) Date: Jul. 26, 2002

(87) PCT Pub. No.: WO02/45470
PCT Pub. Date: Jun. 6, 2002

(65) Prior Publication Data
US 2003/0108729 A1 Jun. 12, 2003

(30) Foreign Application Priority Data
Nov. 30, 2000 (JP) .................................. 2000-365401

(51) Int. Cl.[7] .................. H01L 23/12; H01L 23/053; H01L 23/48; H01L 23/52; H01L 29/40
(52) U.S. Cl. .................. 257/753; 257/701; 257/774
(58) Field of Search .................. 257/701, 758–774, 257/753; 438/125, 622

(56) References Cited
U.S. PATENT DOCUMENTS
5,326,623 A * 7/1994 Yamakawa et al. ......... 428/210

FOREIGN PATENT DOCUMENTS

| | | |
|---|---|---|
| EP | 0 913 372 A1 | 10/1998 |
| JP | 05-105525 A | 4/1993 |
| JP | 06-169173 A | 6/1994 |
| JP | 07-321466 A | 12/1995 |
| JP | 08-018233 A | 1/1996 |
| JP | 09-102565 A | 4/1997 |
| JP | 10-256728 A | 9/1998 |
| JP | 11-163492 A | 6/1999 |
| JP | 11-274725 A | 10/1999 |

* cited by examiner

Primary Examiner—Cuong Nguyen
(74) Attorney, Agent, or Firm—Webb Ziesenheim Logsdon Orkin & Hanson, P.C.

(57) ABSTRACT

A sintered aluminum nitride substrate which has a via hole and an internal electrically conductive layer, having high thermal conductivity and high adhesion strength between the sintered aluminum nitride substrate and the internal electrically conductive layer or the via hole and having other excellent properties. The substrate comprising an internal electrically conductive layer, at least one electrically conductive via hole formed between the internal electrically conductive layer and at least one surface of the substrate, wherein the thermal conductivity of the aluminum nitride sintering product at 25° C. is 190 W/mK or more, and the adhesion strength between the aluminum nitride sintering product and the internal electrically conductive layer is 5.0 kg/mm² or more.

10 Claims, 2 Drawing Sheets

SUBSTRATE AND PRODUCTION METHOD THEREFOR

BACKGROUND OF THE INVENTION

1. Field of the Invention

The present invention relates to a substrate having inside an electrically conductive layer (internal electrically conductive layer), having an electrically conductive via hole formed between the internal electrically conductive layer and the surface of the substrate, which is formed from an aluminum nitride sintering product, and relates to a process for producing the substrate. More particularly, the invention relates to the above-mentioned substrate which has high thermal conductivity, good adhesion properties between the aluminum nitride sintering product and the internal electrically conductive layer or the electrically conductive via hole and high denseness of the internal electrically conductive layer and the electrically conductive via hole and hardly suffers warpage, and relates to a process for producing the substrate.

2. Description of the Prior Art

Since aluminum nitride sintering products have excellent properties such as high thermal conductivity, good electrical insulation properties and a coefficient of thermal expansion almost equal to that of Silicon (Si) for forming integrated circuits, they are used as substrates (sometimes referred to as "aluminum nitride substrates" hereinafter) on which semiconductor circuit parts are mounted. Particularly, aluminum nitride substrates having a so-called electrically conductive via hole (sometimes referred to as a "via hole" simply hereinafter) that is a through hole filled with an electrically conductive material enable electrical connection between external circuits of a semiconductor through the via hole, and hence they are extremely useful.

In recent years, miniaturization of semiconductor circuit manufactured articles and improvement of performance thereof have been promoted, and with such promotion, the number of the via holes formed in the aluminum nitride substrates has been increased and the arrangement of the via holes has been complicated. To meet such market requirements, there has been utilized such an aluminum nitride substrate (1) as shown in the sectional view of FIG. 1, which has inside an internal electrically conductive layer (2) and plural electrically conductive via holes (3) which are electrically connected to one another through the internal electrically conductive layer. The aluminum nitride substrate having an electrically conductive layer inside can be produced by laminating plural aluminum nitride molded products having via holes through electrically conductive paste layers and then dewaxing and sintering the resulting aluminum nitride molded product laminate.

The aluminum nitride sintering product produced by the above process, however, has a thermal conductivity of at most about 170 W/mK at 25° C. because of restriction imposed by that sintering of the electrically conductive layer and sintering of the substrate are simultaneously carried out.

On the other hand, as one method to calcine aluminum nitride (simple substrate) having no via hole and no conductive layer, a two-step firing method wherein the sintering temperature is changed in the specific range is carried out (Japanese Patent Laid-Open Publication No. 105525/1993). In this method, a high thermal-conductive aluminum nitride sintering product having a thermal conductivity of about 200 W/mK at 25° C. can be obtained.

When the sintered aluminum nitride substrate having the via hole and the internal electrically conductive layer is prepared according to the above-mentioned two-step firing method, however, it was difficult to obtain sufficiently high adhesion strength between the aluminum nitride sintering product and the internal electrically conductive layer. Further, there was a problem that the electrically conductive layer did not have satisfactory denseness and as a result cracks occurred inside the aluminum nitride substrate or the value of resistance of the via hole was increased. Moreover, there was a problem of large warpage of the substrate.

Accordingly, it has been desired to develop an aluminum nitride substrate with a via hole and an internal electrically conductive layer, which has a high thermal conductivity of the aluminum nitride sintering product, high adhesion strength of the internal electrically conductive layer or the via hole to the aluminum nitride sintering product and other excellent properties.

SUMMARY OF THE INVENTION

The present inventors have found that the defects of the substrate are caused by the action of carbon after dewaxing, and further found the following: cracks occurring inside the aluminum nitride substrate and increase of warpage of the substrate can be inhibited by controlling the carbon residue of the dewaxed aluminum nitride molded product laminate to the specific range; the adhesion strength between the aluminum nitride sintering product and the internal electrically conductive layer or the via hole can be sufficiently enhanced and stabilized by controlling the carbon residue of the dewaxed laminate, the composition of the electrically conductive paste used and the temperature range of the two-step firing method to the specific ranges; and the thermal conductivity of the aluminum nitride sintering product can also be sufficiently enhanced by these operations.

The substrate according to the invention is a substrate having an internal electrically conductive layer, at least one electrically conductive via hole formed between the internal electrically conductive layer and at least one surface of the substrate, which is formed from an aluminum nitride sintering product, wherein:

the thermal conductivity of the aluminum nitride sintering product at 25° C. is 190 W/mK or more, and the adhesion strength between the aluminum nitride sintering product and the internal electrically conductive layer is 5.0 kg/mm$^2$ or more.

In the substrate of the invention, the adhesion strength between the aluminum nitride sintering product and the electrically conductive via hole is preferably 5.0 kg/mm$^2$ or more.

In the substrate of the invention, it is preferable that the electrically conductive via hole comprises a sintering product of an electrically conductive paste having a refractory metal concentration of 85 to 95% by weight and the internal electrically conductive layer comprises a sintering product of an electrically conductive paste having a refractory metal concentration of 65 to 83% by weight.

A metallized substrate according to the invention has an electrically conductive pattern formed on at least one surface of both surfaces of the above-mentioned substrate, wherein at least a part of the electrically conductive pattern is electrically connected to the electrically conductive via hole.

The process for producing a substrate according to the invention comprises:

forming at least one via hole-forming through hole in a first aluminum nitride molded product comprising an aluminum nitride powder, a sintering aid and an organic binder, filling the through hole with an electrically conductive paste (A) comprising 100 parts by weight of a refractory metal powder and 2 to 10 parts by weight of an aluminum nitride powder, coating the surface of the first aluminum nitride molded product with an electrically conductive paste (B) comprising 100 parts by weight of a refractory metal powder and 2 to 20 parts by weight of an aluminum nitride powder to form an electrically conductive paste layer, laminating a second aluminum nitride molded product comprising an aluminum nitride powder, a sintering aid and an organic binder on the first aluminum nitride molded product through the layer of the electrically conductive paste (B), and dewaxing the resulting aluminum nitride molded product laminate so that the carbon residue becomes 800 to 3000 ppm, then sintering the laminate at a temperature of 1200 to 1700° C. and further sintering the laminate at a temperature of 1800 to 1950° C.

In the above process, it is preferable that the concentration of the refractory metal in the electrically conductive paste (A) with which the via hole-forming through hole of the first aluminum nitride molded product is to be filled is in the range of 85 to 95% by weight and the concentration of the refractory metal in the electrically conductive paste (B) with which the surface of the first aluminum nitride molded product is to be coated is in the range of 65 to 83% by weight.

It is particularly preferable that the viscosity of the electrically conductive paste (A) with which the via hole-forming through hole of the first aluminum nitride molded product is to be filled is in the range of 100 to 30000 poise at 25° C./5 rpm and the viscosity of the electrically conductive paste (B) with which the surface of the first aluminum nitride molded product is to be coated is in the range of 800 to 1200 poise at 25° C./5 rpm.

According to the process of the invention, the aforesaid substrate of the invention can be produced.

DETAILED DESCRIPTION OF THE INVENTION

Figure 1:
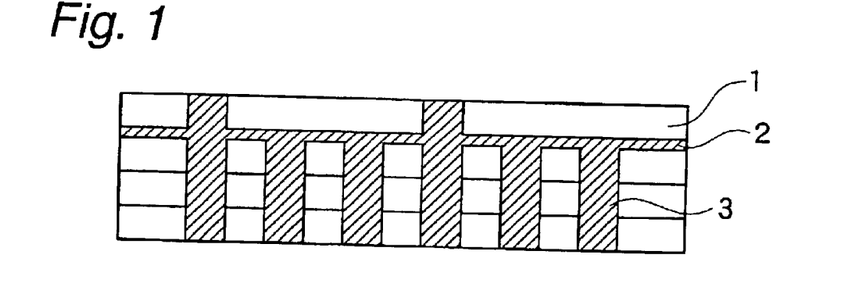
FIG. 1 is a schematic sectional view of a substrate, in a typical embodiment, according to the present invention.

The substrate 1 of the invention comprising an aluminum nitride sintering product has an electrically conductive layer 2 formed inside. Although the thickness of the internal electrically conductive layer is not specifically restricted, it is usually in the range of 5 to 50 μm. The material to constitute the internal electrically conductive layer is not specifically restricted provided that it is a refractory metal. The material is usually a refractory metal such as tungsten or molybdenum and is preferably one containing aluminum nitride in an amount of 2 to 20 parts by weight based on 100 parts by weight of the refractory metal.

The internal electrically conductive layer is usually formed as a flat film inside the substrate. Although this layer is generally formed in parallel to both surfaces of the substrate, it may be provided as a layer inclined to the substrate surface to a certain extent when necessary.

The internal electrically conductive layer does not need to be provided all over the horizontal section of the aluminum nitride substrate, and it may be provided partially. It is particularly preferable to form the internal electrically conductive layer as a desired circuit pattern according to the positions and the number of the electrically conductive via holes 3 to be formed. The proportion of the internal electrically conductive layer to the horizontal section of the aluminum nitride substrate is desired to be in the range of usually 30 to 100%.

In the present invention, two or more internal electrically conductive layers may be provided at prescribed intervals inside the aluminum nitride sintering product. In this case, at least one via hole is generally formed between the internal electrically conductive layers to electrically connect those layers to each other.

In the aluminum nitride substrate of the invention, at least one via hole to link (electrically connect) the internal electrically conductive layer to at least one surface of the substrate is formed. The via hole may be formed between the internal electrically conductive layer and one surface of the substrate or may be formed with penetrating the upper and the lower surfaces of the substrate through the internal electrically conductive layer.

When plural via holes are formed in the substrate of the invention, via holes corresponding to the pattern of the internal electrically conductive layer are electrically connected to one another through the internal electrically conductive layer. Although the number of via holes is not specifically restricted, the proportion of the total volume of all the via holes to the volume of the whole aluminum nitride sintering product containing the via holes is preferably in the range of 0.1 to 20%.

Although the size of the via hole is not specifically restricted, the diameter is preferably in the range of 0.03 to 0.50 mm, and the ratio of the length to the diameter (length/diameter) is preferably not more than 40.

The electrically conductive material filled in the via hole is not specifically restricted provided that it is a refractory metal. Usually, a high-melting point such as tungsten or molybdenum is employed. The electrically conductive material is preferably one containing aluminum nitride in an amount of 2 to 10 parts by weight based on 100 parts by weight of the refractory metal.

Typical embodiments of the substrate of the invention having an internal electrically conductive layer and a via hole formed therein are, for example, those shown in the sectional views of FIGS. 1 to 4.

The aluminum nitride substrate of the invention has striking characteristics that the thermal conductivity of the aluminum nitride sintering product is not less than 190 W/mK and the adhesion strength between the aluminum nitride sintering product and the internal electrically conductive layer is 5.0 kg/mm$^2$ or more.

Since the aluminum nitride substrate of the invention is of a so-called composite system containing a via hole and an internal electrically conductive layer, it is difficult to accurately evaluate the thermal conductivity of the substrate itself in many cases. In the present invention, therefore, a thermal conductivity of an aluminum nitride substrate of the same thickness, which is made of the same material by the same batchwize dewaxing and sintering but has no via hole and no internal electrically conductive layer, is employed as the thermal conductivity of the aluminum nitride sintering product of the invention. If the thermal conductivity of the aluminum nitride sintering product portion can be directly measured using a residual portion obtained by removing the internal electrically conductive layer and the via hole from the aluminum nitride sintering product by grinding or the like, it is a matter of course to take the measured value as the thermal conductivity. In the present invention, the thermal conductivity is a value measured at 25° C.

In the present invention, the adhesion strength between the aluminum nitride sintering product and the internal electrically conductive layer is measured in the following manner. The surface of the substrate is ground until the internal electrically conductive layer is exposed outside, and on the thus exposed internal electrically conductive layer, a thin film of Ti/Pt/Au is formed. Then, the substrate is cut to give a chip of about 5 mm×5 mm. Onto the thin film of the chip, a pin of 0.5 mmØ with a flat tip is soldered perpendicularly. Then, the pin is pulled in the perpendicular direction to measure a breaking strength. In this measurement, whether the via hole underlies the internal electrically conductive layer onto which the pin is to be soldered have little influence on the value of the adhesion strength irrespective of the proportion of the underlying via hole to the internal electrically conductive layer.

The above-mentioned measurement is carried out by appropriately selecting the position of the pin at which the internal electrically conductive layer is present all over the lower surface of the pin to be soldered. If the internal electrically conductive layer is formed by such a fine circuit pattern that the measurement by the selection of the above position is difficult, conversion based on the area of the internal electrically conductive layer actually evaluated has to be made.

It has been heretofore difficult to satisfy both of increase of thermal conductivity of the aluminum nitride sintering product and increase of adhesion strength between the aluminum nitride sintering product and the internal electrically conductive layer. In the substrate of the invention, however, the thermal conductivity of the aluminum nitride sintering product is 190 W/mK or more and the adhesion strength between the aluminum nitride sintering product and the internal electrically conductive layer is 5.0 kg/mm$^2$ or more, so that the values of those properties are both high. Moreover, by selecting the production conditions from more preferred ranges, a substrate wherein the thermal conductivity of the aluminum nitride sintering product is 200 W/mK or more and the adhesion strength is 7.0 kg/mm$^2$ or more, particularly 10.0 kg/mm$^2$ or more, can be obtained.

In the substrate according to the invention, the adhesion strength between the aluminum nitride sintering product and the electrically conductive via hole is preferably 5.0 kg/mm$^2$ or more, more preferably 7.0 kg/mm$^2$ or more, particularly preferably 10.0 kg/mm$^2$ or more.

The adhesion strength between the aluminum nitride sintering product and the electrically conductive via hole stands for a breaking strength measured by cutting the substrate across the center of the via-hole, polishing the cut surface like a mirror surface, forming a thin Ti/Pt/Au film on the cut surface, soldering a pin of a diameter of 0.5 mm having a flat end in a manner to come in contact with the surface of the via-hole perpendicularly thereto, and pulling the pin from a direction perpendicular thereto.

Next, the process for producing an aluminum nitride substrate according to the invention is described. The aluminum nitride substrate of the above structure may be a substrate produced by any process, but it is preferably obtained by a process comprising:

forming at least one via hole-forming through hole in a first aluminum nitride molded product comprising an aluminum nitride powder, a sintering aid and an organic binder, filling the through hole with an electrically conductive paste (A) comprising 100 parts by weight of a refractory metal powder and 2 to 10 parts by weight of an aluminum nitride powder, coating the surface of the first aluminum nitride molded product with an electrically conductive paste (B) comprising 100 parts by weight of a refractory metal powder and 2 to 20 parts by weight of an aluminum nitride powder to form an electrically conductive paste layer, laminating a second aluminum nitride molded product comprising an aluminum nitride powder, a sintering aid and an organic binder on the first aluminum nitride molded product through the layer of the electrically conductive paste (B), and dewaxing the resulting aluminum nitride molded product laminate so that the carbon residue becomes 800 to 3000 ppm, then sintering the laminate at a temperature of 1200 to 1700° C. and further sintering the laminate at a temperature of 1800 to 1950° C.

There is no specific limitation on the aluminum nitride powder to constitute the first and the second aluminum nitride molded products, and any of commonly known ones is employable. In particular, a powder having an average particle diameter, as measured by a sedimentation method, of not more than 5 μm is preferably employed, and a powder having an average particle diameter of not more than 3 μm is more preferably employed, and a powder having an average particle diameter of 0.5 to 2 μm is most preferably employed. Further, an aluminum nitride powder having an average particle diameter D1, as calculated using the specific surface area, and an average particle diameter D2, as measured by a sedimentation method, which satisfy the following formulas is preferably employed, because such an aluminum nitride powder can reduce a linear shrinkage ratio in the firing process and thereby improve dimensional stability of the sintering product or bring the linear shrinkage ratio close to that of the internal electrically conductive layer, whereby the adhesion strength between the aluminum nitride sintering product and the via hole or the internal conductive electrically conductive layer can be further enhanced.

$$0.2 \mu m \leq D1 \leq 1.5 \mu m$$

$$D2/D1 \leq 2.60$$

Also preferable is an aluminum nitride powder which has an oxygen content of not more than 3.0% by weight and a cation impurity content of not more than 0.5% by weight with the proviso that the composition of the aluminum nitride is AlN, and particularly preferable is an aluminum nitride powder having an oxygen content of 0.4 to 1.0% by weight, a cation impurity content of not more than 0.2% by weight and a total amount of Fe, Ca, Si and C among the cation impurities being not more than 0.17% by weight. When such an aluminum nitride powder is used, the thermal conductivity of the resulting aluminum nitride sintering product is greatly improved, so that such an aluminum nitride powder is preferably used.

As the sintering aid added to the aluminum nitride molded product in the present invention, commonly known sintering aid can be used without any restriction. Specifically, an alkaline earth metal compound, e.g., an oxide such as calcium oxide, or a compound comprising yttrium or a lanthanide element, e.g., an oxide such as yttrium oxide, is preferably used.

Likewise, as the organic binder used for the aluminum nitride molded product in the present invention, commonly known organic binders can be used without any restriction. Examples of the organic binders include acrylic resins, such as polyacrylic esters and polymethacrylic esters; cellulose resins, such as methyl cellulose, hydroxymethyl cellulose, nitrocellulose and cellulose acetate butyrate; vinyl group-containing resins, such as polyvinyl butyral, polyvinyl alcohol and polyvinyl chloride; hydrocarbon resins, such as polyolefins; and oxygen-containing resins, such as polyethylene oxide. These resins are used singly or in combination of two or more kinds. Of these, the acrylic resins are preferably used because they have good dewaxability and can reduce resistance of a via hole. As other components such as a solvent, a dispersant and a plasticizer, those commonly known can likewise be used without any restriction.

As for the proportions of the components for constituting the first and the second aluminum nitride molded products, commonly known proportions can be adopted without any restriction in the present invention. For example, the sintering aid in an amount of 0.01 to 10 parts by weight and the organic binder in an amount of 0.1 to 30 parts by weight are preferably used based on 100 parts by weight of aluminum nitride. Particularly, the sintering aid in an amount of 2 to 7 parts by weight is preferably adopted since such amount is advantageous in the enhancement of the thermal conductivity. Likewise, there is no specific limitation on the process for producing an aluminum nitride molded product using these components, and in general, the molded product is formed as a green sheet by a doctor blade method. The green sheet may used singly, or plural green sheets may be laminated together to give a united one having a desired thickness, prior to use.

In the present invention, each of the electrically conductive pastes used for forming the via hole and the internal electrically conductive layer contains the aforesaid type of the refractory metal powder. As the refractory metal powder for the electrically conductive paste (A) for forming the via hole, a powder having an average particle diameter, as measured by the Fischer's method, of 1 to 2.5 $\mu$m is preferably used, and a powder having an average particle diameter of 1.6 to 2.0 $\mu$m is most preferably used, because occurrence of cracks inside the via hole can be effectively inhibited. As the refractory metal powder for the electrically conductive paste (B) for forming the internal electrically conductive layer, a powder having an average particle diameter, as measured by the Fischer's method, of 0.8 to 5.0 $\mu$m is preferably used, and a powder having an average particle diameter of 1.0 to 3.0 $\mu$m is most preferably used, because a dense internal electrically conductive layer is formed and occurrence of warpage of the aluminum nitride substrate can be effectively reduced.

As the aluminum nitride powder used for both electrically conductive pastes, an aluminum nitride powder commonly known can be used without any restriction. Particularly, the aluminum nitride powder of the aforesaid properties that is preferably used for the aluminum nitride molded product is preferably used, because not only does it have good sintering properties with the refractory metal powder and thereby exhibits an effect to enhance adhesion properties of the internal electrically conductive layer, but also it reduces a difference in the shrinkage ratio between the aluminum nitride portion and the internal electrically conductive layer portion to improve dimensional stability of the sintering product.

In the present invention, the electrically conductive paste (A) for forming the electrically conductive via hole has a composition containing 2 to 10 parts by weight of the aluminum nitride powder based on 100 parts by weight of the refractory metal powder. If the amount of the aluminum nitride powder is less than 2 parts by weight in the electrically conductive paste, the adhesion strength between the via hole and the aluminum nitride sintering product becomes low or the difference in the shrinkage ratio between the via hole portion and the aluminum nitride sintering product portion is increased to bring about a gap in the junction interface.

If the amount of the aluminum nitride powder is more than 10 parts by weight, the viscosity of the electrically conductive paste becomes high to deteriorate filling properties of the paste, and as a result, adhesion strength between the via hole and the aluminum nitride sintering product is lowered by the voids produced, or discoloration due to aluminum nitride is liable to take place on the surface of the via hole to increase the value of resistance. When the amount of the aluminum nitride powder is in the range of 3 to 7 parts by weight, the difference in the firing shrinkage ratio between the via hole and the ceramic is extremely small, so that the stress generated around the via hole is small and the electrical resistance of the via hole can be decreased. Hence, such amounts are preferable.

On the other hand, the electrically conductive paste (B) for forming the internal electrically conductive layer has a composition containing 2 to 20 parts by weight of the aluminum nitride powder based on 100 parts by weight of the refractory metal powder. If the amount of the aluminum nitride powder is less than 2 parts by weight in the electrically conductive paste, the adhesion strength between the internal electrically conductive layer and the aluminum nitride sintering product is lowered, or the difference in the shrinkage ratio between the aluminum nitride sintering product portion and the internal electrically conductive layer portion is increased to bring about separation on the junction interface. If the amount of the aluminum nitride powder is more than 20 parts by weight, the viscosity of the electrically conductive paste becomes high to deteriorate printability. On this account, printing non-uniformity or blur takes place to lower adhesion strength between the internal electrically conductive layer and the aluminum nitride sintering product and to increase electrical resistance of the internal electrically conductive layer itself.

If the amount of the aluminum nitride powder is more than 20 parts by weight, further, storage stability of the electrically conductive paste itself is decreased. Therefore, if the electrically conductive paste is used after a passage of several days from the preparation, the viscosity of the electrically conductive paste becomes high to deteriorate printability, and as a result, adhesion strength between the internal electrically conductive layer and the aluminum nitride sintering product is lowered by the printing non-uniformity or blur produced. In the electrically conductive paste for forming the internal electrically conductive layer, the amount of the aluminum nitride powder is in the range of preferably 2 to 18 parts by weight, more preferably 11 to 18 parts by weight, from the viewpoint of storage stability.

In addition to the refractory metal and the aluminum nitride powder, to each of the electrically conductive pastes used for forming the via hole and the internal electrically conductive layer are generally added an organic binder, an organic solvent, etc. to make them pasty. Examples of the organic binders include acrylic resins, such as polyacrylic esters and polymethacrylic esters; cellulose resins, such as methyl cellulose, ethyl cellulose, hydroxymethyl cellulose, nitrocellulose and cellulose acetate butyrate; vinyl group-containing resins, such as polyvinyl butyral, polyvinyl alcohol and polyvinyl chloride; hydrocarbon resins, such as polyolefins; and polyethylene oxide. Examples of the organic solvents include di-n-butyl phthalate, diethylene glycol mono-n-hexyl ether, 2-(2-butoxyethoxy)ethyl acetate and terpineol.

In the electrically conductive paste (A) for forming the via hole, the concentration of the refractory metal is in the range of preferably 85 to 95% by weight, more preferably 87 to 93% by weight, from the viewpoints of enhancement of the adhesion strength of the via hole and inhibition of occurrence of cracks inside the via hole. In the electrically conductive paste (B) for forming the internal electrically conductive layer, the concentration of the refractory metal is in the range of preferably 65 to 83% by weight, more preferably 72 to 83% by weight, from the viewpoint of obtaining higher adhesion strength of the resulting electrically conductive layer to the aluminum nitride sintering product.

The electrically conductive paste (A) for forming the via hole is desirably prepared so as to have a viscosity of preferably 100 to 30000 poise, more preferably 500 to 7000 poise, at 25° C./5 rpm, from the viewpoints of enhancement of adhesion strength of the via hole and inhibition of occurrence of cracks inside the via hole. The electrically conductive paste (B) for forming the internal electrically conductive layer is desirably prepared so as to have a viscosity of preferably 800 to 1200 poise, more preferably 850 to 1000 poise, at 25° C./5 rpm, from the viewpoint of obtaining higher adhesion strength of the resulting electrically conductive layer to the aluminum nitride sintering product. In the preparation of these electrically conductive pastes, other components commonly known, such as a dispersant and a plasticizer, are used without any restriction.

In the present invention, a through hole formed in the first aluminum nitride molded product is filled with the via hole-forming electrically conductive paste (A) to obtain an aluminum nitride molded product having a via hole-forming through hole filled with the paste (A). There is no specific limitation on the method to form a through hole in the aluminum nitride molded product, and a method generally used, such as metal mold punching method or a method of using a punching machine, is employed. The diameter of the through hole is preferably in the range of 0.05 to 0.50 mm in consideration of a desired hole diameter of a via hole formed in the substrate.

For filling the through hole with the electrically conductive paste (A), commonly known methods can be adopted without any restriction. Specifically, a printing method, the pressurized penetration method or the like is used. When the ratio of the length to the diameter (length/diameter) of the through hole is larger than 2.5, the pressurized penetration method is preferably used since the filling can be made more easily.

In the present invention, the surface of the first aluminum nitride molded product having a through hole filled with the electrically conductive paste is then coated with the electrically conductive paste (B) for forming the internal electrically conductive layer. For the coating, commonly known methods are adopted without any restriction. In general, coating by screen printing is preferably used.

Subsequently, on the first aluminum nitride molded product, a second aluminum nitride molded product that is different from the first aluminum nitride molded product is laminated by interposing the electrically conductive paste layer formed as above. The second aluminum nitride molded product comprises the same aluminum nitride powder, sintering aid and organic binder as previously described. The second aluminum nitride molded product may be one having a via hole-forming through hole or one having no via hole-forming through hole. The through hole formed in the second aluminum nitride molded product may not be filled with any via hole-forming electrically conductive paste. Also on the surface of the second aluminum nitride molded product, the same layer of the electrically conductive paste (B) as previously described may be formed.

Further, three or more aluminum nitride molded products may be laminated with interposing therebetween the electrically conductive paste layers. Furthermore, on one or both surfaces of the resulting aluminum nitride molded product laminate, the electrically conductive paste layer may be provided as a surface layer. The structure of the aluminum nitride molded product laminate is properly designed according to the structure of the desired aluminum nitride substrate.

For laminating the aluminum nitride molded products, commonly known methods are adopted without any restriction. In general, the molded products are preferably laminated and united by a hot pressing method or a hot water isotropic pressure method.

The aluminum nitride molded product laminate obtained as above needs to be dewaxed so that the aluminum nitride portion (aluminum nitride molded product except via hole portion and internal electrically conductive layer portion) has a carbon residue of 800 to 3000 ppm, preferably 1200 to 2500 ppm. If the carbon residue is less than 800 ppm, the thermal conductivity of the aluminum nitride sintering product becomes lower than 190 W/mK, and hence the object of the present invention cannot be attained. If the carbon residue exceeds 3000 ppm, the sintering properties of the refractory metal powder becomes bad, and therefore uniform and sufficient adhesion strength between the aluminum nitride sintering product and the via hole or the internal electrically conductive layer cannot be obtained. In addition, cracks take place in the aluminum nitride portion or warpage of the aluminum nitride substrate becomes large, and hence the object of the present invention cannot be attained.

In the dewaxing step, the dewaxing atmosphere is not specifically restricted except an oxidizing atmosphere such as the open air which is liable to oxidize the refractory metal. For example, an atmosphere of an inert gas such as nitrogen, argon or helium, an atmosphere of a reducing gas such as hydrogen, an atmosphere of a mixed gas thereof, an atmosphere of a moistened gas thereof, or vacuum is preferably employed.

The dewaxing temperature is appropriately selected and is in the range of usually 500 to 1200° C., preferably 800 to 1000° C. Although the heating rate to attain this temperature is not specifically restricted, it is preferably not more than 10° C./min.

The dewaxing time is determined so that the carbon residue of the molded product after dewaxing will be in the range of 800 to 3000 ppm. Although the period of time for which the dewaxing temperature is maintained varies to some extent depending upon such condition as the thickness of the molded product, density of the molded product, proportions of the via hole and the internal electrically conductive layer, dewaxing temperature, etc., it is usually determined within the range of 1 to 600 minutes.

The aluminum nitride molded product laminate having been dewaxed as above (referred to as "dewaxed laminate" hereinafter) is then sintering in a non-oxidizing atmosphere or a dried reducing gas atmosphere. The non-oxidizing atmosphere is, for example, an atmosphere of a single gas such as nitrogen, argon or helium or a mixed gas thereof, or a vacuum (or reduced pressure) atmosphere. The dried reducing gas atmosphere is, for example, an atmosphere of hydrogen or a mixture of hydrogen and an inert gas.

As for the temperature conditions in the firing, the dewaxed laminate needs to be sintered at a temperature of 1200 to 1700° C., preferably 1500 to 1650° C., in the first step, and then sintered at a temperature of 1800 to 1950° C., preferably 1820 to 1900° C., in the second step. If the firing temperature in the first step is lower than 1200° C., reaction for removing oxygen in the aluminum nitride by reduction with carbon remaining in the dewaxed laminate hardly proceeds, and therefore the thermal conductivity of the aluminum nitride sintering product becomes lower than 190 W/mK. Consequently, the object of the present invention cannot be attained. On the other hand, if the firing temperature in the first step exceeds 1700° C., sintering of aluminum nitride proceeds before the reaction for removing oxygen from the aluminum nitride by reduction with carbon remaining in the dewaxed laminate sufficiently proceeds, and as a result, oxygen is diffused and dissolved in the aluminum nitride to inhibit increase of thermal conductivity of the aluminum nitride sintering product. Consequently, the object of the present invention cannot be attained. When the firing temperature in the first step is in the range of 1500 to 1650° C., the reduction reaction to remove oxygen proceeds effectively, so that this temperature range is preferable.

If the firing temperature in the second step is lower than 1800° C., the aluminum nitride cannot be sufficiently sintered, and therefore the thermal conductivity of the aluminum nitride sintering product becomes lower than 190 W/mK. Consequently, the object of the present invention cannot be attained. If the firing temperature in the second step exceeds 1950° C., not only the adhesion strength between the via hole or the internal electrically conductive layer and the substrate is lowered but also warpage of the aluminum nitride substrate becomes larger than 200 μm. Consequently, the object of the present invention cannot be attained. Although the heating rate to attain this temperature is not specifically restricted, it is preferably in the range of 1 to 40° C./min.

The period of time for which the above temperature is maintained is not specifically restricted, but it is usually determined in the range of 30 minutes to 10 hours in the first step and in the range of 1 minute to 20 hours in the second step. The firing in the first and the second steps may be carried out as one-time sintering without decreasing the firing temperature, or may by carried out as two-time sintering by decreasing the firing temperature between the first step and the second step. In consideration of the time and energy efficiency, however, the sintering is preferably carried out as one-time firing without decreasing the firing temperature.

When the distance between the upper or the lower surface of the substrate and the internal electrically conductive layer in the substrate to be produced by the above process is prescribed, the substrate satisfying such requirement can be obtained by, for example, exposing the side end of the internal electrically conductive layer outside on the side surface of the substrate, then abrading or grinding the upper or the lower surface of the substrate with measuring the distance from the upper or the lower surface of the substrate and stopping the abrading or grinding when the prescribed distance is reached.

If warpage of the substrate having the internal electrically conductive layer is large when the above processing is carried out, the location of the internal electrically conductive layer cannot be maintained accurately. In an extreme case, the internal electrically conductive layer is exposed outside on the substrate surface after the processing. The internal electrically conductive layer exposed outside on the substrate surface causes short circuit of the electrically conductive pattern formed on the substrate surface, and for this reason, the warpage is preferably made as small as possible prior to the above processing.

The aluminum nitride substrate of the invention is usually used for preparing a metallized substrate having a structure wherein an electrically conductive pattern is formed on at least one surface of the both surfaces facing each other and at least a part of the electrically conductive pattern is electrically connected to the via hole. In this case, the electrically conductive pattern may be formed on only one surface of the substrate, or may be formed on both surfaces so that these surfaces are electrically connected to each other by means of via holes which connect the upper and the lower surfaces of the substrate through the internal electrically conductive layer.

The electrically conductive pattern in the invention is not specifically restricted provided that it has electrical conductivity, for example, a metallic thin film or a thick film composed of a metal powder and an inorganic or organic binder is usually used. Of such films, the metallic thin film is most preferably used because of high electrical conductivity. As the metal to constitute the metallic thin film, commonly known metals are used without any restriction. Specifically, titanium (Ti), chromium (Cr), molybdenum (Mo), tungsten (W), aluminum (Al), tantalum (Ta), tungsten-titanium (W—Ti), nickel-chromium (Ni—Cr) and tantalum nitride (Ta—N) are preferably used because they have good adhesion to the aluminum nitride sintering product.

The above metals may be used singly or in combination of two or more kinds. The electrically conductive pattern may be formed as a single layer or a laminate of two or more layers.

In case of a laminate of two or more layers, it is preferable to use the above-mentioned metals for the first layer which is brought into contact with the aluminum nitride sintering product since they have good adhesion strength to the aluminum nitride sintering product. Of those metals, Ti is more preferably used since high adhesion strength can be stably obtained. Although the thickness of the first layer used as an adhesive layer is not specifically restricted, it is in the range of usually 0.01 to 10 μm, preferably 0.05 to 5 μm, from the viewpoint of balance between guarantee of the reliability of adhesion strength due to increase of the film thickness and economical effect due to shortening of the film-forming time and reduction of the materials accompanied by decrease of the film thickness.

For the second layer laminated on the first layer, a commonly known metal can also be used. When the second layer is an outermost layer in the electrically conductive pattern of a two-layer laminate, at least one of platinum (Pt), nickel (Ni), palladium (Pd), copper (Cu), silver (Ag) and gold (Au) is preferably used because of good electrical conductivity. Of these metals, Pt, Pd, Ag or Au is more preferably used because of good corrosion resistance.

When an electrically conductive pattern of a laminate of three or more layers wherein a layer is further laminated on the second layer is used as described later, Pt, Ni, Pd, W, W—Ti or Mo having high ability of diffusion inhibition is more preferably used for the second layer in order to inhibit diffusion of elements of the first and the third layer and thereby ensure stable adhesion strength between the electrically conductive pattern and the sintering product. Although the thickness of the second layer is not specifically restricted, it is in the range of usually 0.01 to 10 μm, preferably 0.05 to 5 μm because of similar reasons for the first layer.

When the third layer is laminated on the second layer, a commonly known metal is employable for the third layer. For example, at least one of Pt, Ni, Pd, Cu, Ag and Au is preferably used because of good electrical conductivity. Of these metals, Pt, Pd, Ag or Au is more preferably used because they have excellent corrosion resistance. Although the thickness of the third layer is not specifically restricted, it is in the range of usually 0.05 to 10 μm from the viewpoints of stability of conductivity and balance between reliability and economical effect.

In order to facilitate soldering of semiconductor elements or the like onto the outermost metal layer, a layer of at least one solder, such as a gold-tin (Au—Sn) solder, a lead-tin (Pb—Sn) solder, a gold-silicon (Au—Si) solder or a gold-germanium (Au—Ge) solder, may be laminated or patterned. Further, a solder material diffusion inhibition layer may be provided between the outermost metal layer and the solder layer. For the diffusion inhibition layer, Pt, Ni, Pd, W, W—Ti or Mo is preferably used because of high ability of diffusion inhibition.

In order to maintain the prescribed value of electrical resistance, a resistor thin film pattern to electrically connect specific patterns of the electrically conductive patterns to each other with the prescribed value of resistance may be formed between the specific patterns of the electrically conductive patterns. The resistor thin film pattern is desired to have small change in the value of resistance with time, and besides it is desired that the value of resistance does not vary even if the temperature of the metallized substrate is changed.

The type of a resistor thin film used for the resistor thin film pattern is not specifically restricted, but preferably used is Ta—N, Ni—Cr of the like from the viewpoint of the stability of the value of the resistance. The composition of the alloy selected is preferably one which causes small change in the value of resistance with temperature. For example, a $Ta_2N$ layer is preferably used as a layer of Ta—N type. Provided that the size of the pattern is the same, the value of resistance becomes smaller with decrease of the film thickness of the resistor thin film. Therefore, the film thickness of the resistor thin film is properly determined according to the size of the desired pattern and the value of resistance. The film thickness thereof is usually in the range of 0.01 to 0.5 μm from the viewpoint of balance between the stability of the value of resistance and the economical effect.

In the electrically conductive pattern, an inductor element and a capacitor element may be formed. The inductor element can be formed by, for example, producing a coil inductor pattern. The capacitor element can be formed by, for example, laminating an insulating film such as a film of tantalum pentoxide ($Ta_2O_5$) on the electrically conductive pattern and then further laminating an electrode film (upper electrode film) on the insulating film.

The metallized substrate is usually produced by the following process. That is, a large-sized substrate is produced by the above process, then electrically conductive patterns are formed repeatedly on the surface of the substrate by the following method, and the substrate is cut into a desired size to obtain plural metallized substrates.

The size of the substrate is preferably large since a great number of metallized substrates with electrically conductive patterns can be formed at once. In general, a sintering product having a size of 1 to 4 inch square is employed.

The substrate surface on which the electrically conductive pattern is to be formed is preferably subjected to grinding or polishing in order to enhance the adhesion strength between the electrically conductive pattern and the substrate. There is no specific limitation on the grinding and the polishing, and any technique commonly known is employed. In general, lapping, polishing, barrel polishing, sand blasting, abrasion using a grinder, or the like is employed. The surface coarseness of the substrate varies depending upon the purpose, but it is preferable to carry out the polishing so that the center-line average coarseness (Ra) becomes not more than 1.0 μm, more preferably not more than 0.1 μm, because reliability of the soldering of the semiconductor element is increased.

For forming the electrically conductive pattern, commonly known methods can be used without any restriction. Examples of the methods preferably used include a sputtering method, a vaporization method, a chemical vapor phase deposition method (CVD), an ion plating method, a melt injection method, a screen printing method, and a sol-gel coating method using spin coating or dip coating. For example, a metallic thin film to form the electrically conductive pattern is formed in the following manner in accordance with the sputtering method. A target containing a component of the metallic thin film is used, and the temperature of the substrate is usually set in the range of room temperature to 300° C. After the vacuum vessel is evacuated to not more than $2 \times 10^{-3}$ Pa, an argon gas is introduced, then the vacuum vessel is maintained at a pressure of 0.2 to 1.0 Pa, and the power of the RF (high-frequency) electric source is set in the range of 0.2 to 3 kW to form the metallic film having a desired thickness.

For the formation of a thin film composed of a nitride such as Ta—N that is used for the resistor thin film pattern or a thin film composed of an oxide such as $Ta_2O_5$ that is used for the capacitor pattern, a reactive sputtering method is preferably employed. The reactive sputtering method means a method in which a target composed of a metallic component of the objective compound is used, and a reaction gas containing another component of the objective compound such as nitrogen or oxygen is introduced into the vacuum tank together with an electrical discharge gas to perform sputtering, whereby a thin film is obtained. The composition of the resulting thin film is determined according to the ratio between the electrical discharge gas and the reaction gas introduced.

For example, a Ta—N film is formed in the following manner in accordance with the reactive sputtering method. A target of Ta is used, and the temperature of the substrate is usually set in the range of room temperature to 300° C. After the vacuum vessel is evacuated to not more than $2 \times 10^{-3}$ Pa, an argon gas as the electrical discharge gas and a nitrogen gas as the reaction gas are introduced, then the vacuum vessel is maintained at a pressure of 0.2 to 1.0 Pa, and the power of the RF (high-frequency) electric source is set in the range of 0.2 to 3 kW to form the metallic film having a desired thickness.

The shape of the electrically conductive pattern for use in the invention can be arbitrarily selected according to the use purpose, and can be made by patterning a metallic thin film for constituting the electrically conductive pattern. For the patterning, any technique commonly known is adoptable according to the use purpose of the substrate. Specifically, a metal masking method, a wet etching method, a lift-off method, a dry etching method or the like is adopted.

In the patterning by the metal masking method, a metal mask having a desired pattern previously formed is fixed on the substrate, and the aforesaid sputtering or vaporization is carried out to form an electrically conductive pattern.

In the formation of the electrically conductive pattern by the dry etching method, a desired pattern using a photoresist or the like is formed on the metallic thin film having been formed on the substrate by the aforesaid sputtering or vaporization, then the unnecessary portion of the metallic thin film is removed by ion milling or the like, and then the resist is peeled off.

The method to form an electrically conductive pattern in which the circuit pattern contains a resistor thin film pattern is not specifically restricted, and for example, the following methods are available. In one method, an electrically conductive pattern containing a connecting portion to be connected with a resistor thin film pattern is formed on the substrate first. Then, on the electrically conductive pattern, a resistor thin film for forming a resistor thin film pattern is laminated to form a resistor thin film pattern. According to this method, a circuit pattern in which the resistor thin film is laminated on the electrically conductive pattern at the connecting portion can be obtained.

In another method, a resistor thin film pattern of a shape containing a connecting portion is previously formed on the substrate, and on the resistor thin film pattern, an electrically conductive pattern is formed. According to this method, a circuit pattern in which the electrically conductive pattern is laminated on the resistor thin film at the connecting portion can be obtained. Further, the electrically conductive pattern containing a resistor thin film pattern can be formed in the following manner. That is, the resistor thin film itself is used as the first layer that is brought into contact with the substrate. On the resistor thin film, a metallic thin film having an electrical resistivity lower than that of the resistor thin film is laminated to form an electrically conductive pattern, and the metallic thin film formed on the resistor thin film is partially removed between the specific patterns requiring the prescribed value of resistance of the electrically conductive pattern.

In order to suppress the change in the value of resistance due to the lapse of time and temperature, the resistor thin film pattern obtained as above is usually subjected to a treatment for stabilizing the value of resistance (resistance stabilizing treatment) wherein an oxide film is formed on the surface of the resistor thin film. For the resistance stabilizing treatment, commonly known technique can be used without any restriction. For example, formation of an oxide film by an anodizing method or formation of an oxide film by heating the substrate having the resistor thin film pattern in the open air is carried out to stabilize the value of resistance. For adjusting the value of resistance of the resulting resistor thin film pattern, commonly known technique can be used without any restriction. For example, laser trimming is available.

After the metallized substrate is plated with Ni, Au or the like in order to improve solder wettability, an electrode material such as a Si chip or pin can be soldered or brazed onto the substrate. As the plating means, electroless plating, electroplating, combination thereof, and the like can be used without any restriction.

The substrate of the invention may be machined into various shapes by, for example, conducting grooving such as grinding or cutting. For example, the substrate may be subjected to slitting and then cutting to give a convex chip as shown in the perspective view of FIG. 5. This convex machined part is effectively used as a sub-mount, a chip carrier or the like.

As understood from the above description, the aluminum nitride substrate of the invention has a thermal conductivity of 190 W/mK or more at 25° C., and has an extremely high adhesion strength of 5.0 kg/mm$^2$ or more between the aluminum nitride sintering product and the internal electrically conductive layer. Further, the substrate has no cracks in the aluminum nitride sintering product and inside the via hole and hardly suffers warpage. Accordingly, the substrate of the invention is of extremely great value industrially.

If the aluminum nitride substrate of the invention having the above properties is metallized to form a metallic thin film on the substrate surface, the resulting metallized substrate can be favorably used for electronic parts or semiconductor parts, such as a sub-mount or a chip carrier of laser diode or light-emitting diode, a heat sink and an IC package.

EXAMPLE

The present invention is further described with reference to the following examples, but it should be construed that the invention is in no way limited to those examples.

In the examples, various properties were measured by the following methods.

(1) Carbon Residue in Aluminum Nitride Molded Product

The carbon residue was analyzed by a non-difusion type infrared ray-absorption carbon analyzer (EMIA-110, manufactured by Horiba Seisakusho K.K.).

(2) Average Particle Diameter of Aluminum Nitride Powder

The average particle diameter D1 based on the specific surface area was calculated from the following formula.

$$D1(\mu m)=6/(S\times 3.26)$$

S: specific surface area of AlN powder (m$^2$/g)

The average particle diameter D2 based on the sedimentation method was measured by a centrifugal particle size distribution-measuring device CAPA5000 manufactured by Horiba Seisakusho K.K.

(3) Evaluation of Appearance of Aluminum Nitride Substrate

The appearance was observed visually and by a stereomicroscope (×40), followed by evaluation.

A substrate in which no crack and no separation took place on the interface between the aluminum nitride sintering product and the internal electrically conductive layer, and no crack took place inside the aluminum nitride sintering product, and no crack took place in the internal electrically conductive layer was evaluated as good, and a substrate in which at least one of these defects took place was evaluated as bad.

(4) Warpage of Aluminum Nitride Substrate

The warpage was measured by a surface roughness and profile measuring device manufactured by Tokyo Seimitsu K.K.

(5) Thermal Conductivity of Aluminum Nitride Sintering Product

An aluminum nitride substrate of the same thickness, which was prepared from the same materials by the same batchwise dewaxing and sintered but had no via hole and no internal electrically conductive layer, was measured on the thermal conductivity by a laser flash method.

(6) Adhesion Strength Between Internal Electrically Conductive Layer and Aluminum Nitride Sintering Product The aluminum nitride substrate was polished like a mirror surface until the internal electrically conductive layer was exposed outside. Then, on the mirror surface of the substrate, sputtering operations of Ti of 0.06 $\mu$m, Pt of 0.2 $\mu$m and Au of 0.6 $\mu$m were carried out in this order to form a metallic thin film under the high vacuum of 10$^{-3}$ Torr. The substrate was then cut to give a chip of about 5 mm×5 mm.

On the treated surface of the chip, a solder preform was placed, and on a hot plate at 230° C., a Ni-plated pin was perpendicularly soldered onto the surface of the substrate. The pin has a flat tip, has a diameter of 0.5 mm and is made of 42-alloy. The solder has a composition consisting of 60% by weight of tin and 40% by weight of lead.

After soldering of the pin, the substrate was set in Strograph M2 manufactured by Toyo Seiki Seisakusho K.K., and the pin was pulled in the perpendicular direction to measure a breaking strength. The rate of pulling was 10 mm/min. The position of the peel interface (peeling mode) was checked by observing the pin and the broken surface of the sintering product after the test by the use of a stereomicroscope (×40), a metallized microscope (×400) and an X-ray microanalyzer.

(7) Adhesion Strength Between Electrically Conductive Via Hole and Aluminum Nitride Sintering Product The substrate was cut across the center of the via hole of the aluminum nitride sintering product, then the cut surface was polished like a mirror surface, and on the cut surface, a thin film of Ti/Pt/Au was formed. Then, a Ni-plated pin was perpendicularly soldered so that the pin was brought into contact with the via hole surface. The pin has a flat tip, has a diameter of 0.5 mm and is made of 42-alloy. The solder has a composition consisting of 60% by weight of tin and 40% by weight of lead. The substrate was set in Strograph M2 manufactured by Toyo Seiki Seisakusho K.K., and the pin was pulled in the perpendicular direction to measure a breaking strength. The rate of pulling was 10 mm/min. The position of peel interface (peeling mode) was checked by observing the pin and the broken surface of the sintering product after the test by the use of a stereomicroscope (×40), a metallized microscope (×400) and an X-ray microanalyzer.

(8) Electrical Resistance of Via Hole

The aluminum nitride substrate was ground to remove a portion above or below the internal electrically conductive layer to allow the substrate to have a mirror surface. The substrate was then divided into small chips, and an electrical resistance of the via hole in each chip was measured.

(9) Electrical Resistance Between Electrically Conductive Pattern and Via Hole

Needle-like probes were brought into contact with the electrically conductive pattern on each surface of the metallized substrate, said electrically conductive pattern being located right above the via hole penetrating the substrate. Then, an electrical resistance of the via hole of the metallized substrate was measured by a four-terminal method.

(10) Appearance of Metallized Substrate

The appearance of the metallized substrate was observed visually and by a stereomicroscope (×40), followed by evaluation.

Whether disconnection of the electrically conductive pattern due to cracks of the via hole or cracks of the aluminum nitride sintering product had taken place or not was checked. A substrate having no disconnection was evaluated as good, and a substrate having even one disconnection was evaluated as bad.

Example 1

100 Parts by weight of an aluminum nitride powder (average particle diameter based on the sedimentation method: 1.50 μm, specific surface area: 2.50 m²/g, average particle diameter calculated from the specific surface area: 0.74 μm, oxygen content: 0.80%) having a composition shown in Table 1, 5 parts by weight of yttoria, 2 parts by weight of n-butyl methacrylate as a dispersant, 11 parts by weight of polybutyl acrylate as an organic binder, 7 parts by weight of dioctyl phthalate as a plasticizer and 50 parts by weight of a mixed solvent of toluene and isopropyl alcohol were weighed, and they were introduced into a ball milling pot, followed by sufficiently mixing by the use of a nylon ball.

TABLE 1

| Analytic value of AlN powder | |
|---|---|
| AlN content | 97.9% |
| Element | Content |
| Ca | 105 ppm |
| Si | 63 ppm |
| Fe | 12 ppm |
| Ti | 16 ppm |
| V | 0.8 ppm |
| O | 0.80% |
| C | 0.03% |

The resulting slurry was introduced into a defoaming apparatus so as to have a viscosity of 20000 cps, and using the slurry, a sheet was formed on a polypropylene film by a doctor blade type sheet-forming machine to prepare an aluminum nitride green sheet having a thickness of about 0.40 mm.

The aluminum nitride green sheet was cut into a size of 65×65 mm. Then, three of the aluminum nitride green sheets were laminated together to prepare an aluminum nitride molded product (I). The laminating pressure was 50 kgf/cm², the laminating temperature was 80° C., and the laminating time was 15 minutes.

Then, the aluminum nitride molded product (I) (65×65 mm) was punched by a punching metal mold having a diameter of 0.28 mm maintaining a pitch of 0.5 mm in order to form through holes arranged in a number of 120×120. Separately, to 100 parts by weight of a tungsten powder (average particle diameter based on the Fischer's method: 1.8 μm) were added 5 parts by weight of the aluminum nitride powder, 1.5 parts by weight of ethyl cellulose as an organic binder, 5.0 parts by weight of 2-(2-butoxyethoxy) ethyl acetate as a solvent and some amounts of a plasticizer and a dispersant, and they were sufficiently kneaded by means of an automatic mortar and then a roll mill having three rolls to obtain a paste (paste (A) for forming electrically conductive via hole) having a viscosity of 2300 poise at 25° C./5 rpm. The concentration of the refractory metal in the paste (A) was 90.8% by weight. The paste (A) was filled in the through holes of the aluminum nitride molded product (I) by the pressurized penetration method. The filling pressure was 50 psi, and the filling time was 120 seconds.

Then, to 100 parts by weight of a tungsten powder (average particle diameter based on the Fischer's method: 2.5 μm) were added 5 parts by weight of the aluminum nitride powder, 2 parts by weight of ethyl cellulose, 20 parts by weight of terpineol and some amounts of a plasticizer and a dispersant, and they were sufficiently kneaded by means of a grinding mill and then a roll mill having three rolls to obtain a paste (paste (B) for forming internal electrically conductive layer) having a viscosity of 950 poise at 25° C./5 rpm. The concentration of the refractory metal in the paste (B) was 79.5% by weight. The paste (B) was printed on one surface of the aluminum nitride molded product (I) by screen printing to form a whole surface solid pattern, whereby an electrically conductive paste layer was formed on one surface of the aluminum nitride molded product (I). After drying, the thickness of the electrically conductive layer was measured by a depth indicator, and as a result, the thickness was 20 μm.

Another aluminum nitride green sheet (II) cut into 65×65 mm was punched by a punching metal mold having a diameter of 0.28 mm maintaining a pitch of 1.5 mm in order to form through holes arranged in a number of 40×40. The through holes were filled with the paste (A) by the pressurized penetration method to prepare an aluminum nitride molded product (II). The filling pressure was 650 psi, and the filling time was 180 seconds.

Then, the aluminum nitride molded product (II) was laminated on the electrically conductive paste layer side surface of the aluminum nitride molded product (I). The laminating pressure was 80 kgf/cm$^2$, the laminating temperature was 80° C., and the laminating time was 15 minutes.

The resulting aluminum nitride molded product laminate (i) having via hole-forming through holes filled with the paste (A) and inside an electrically conductive paste layer was dewaxed under heating at 900° C. for 2 hours with passing a dry nitrogen gas at a rate of 30 l/min. The temperature was elevated at a rate of 2.5° C./min. A test sample having been dewaxed under heating at the same time was examined on the carbon residue, and as a result, the carbon residue was 2430 ppm. After dewaxing, the dewaxed laminate was placed in an aluminum nitride container, heated at 1580° C. for 6 hours in a nitrogen atmosphere (first step firing) and then heated at 1870° C. for 10 hours in a nitrogen atmosphere (second step firing). Thus, an aluminum nitride substrate having a thickness of 1.2 mm and a structure shown in the sectional view of FIG. 1 was prepared.

Various properties of the aluminum nitride substrate obtained were measured. The results are set forth in Table 3.

Examples 2 and 3, Comparative Examples 1 and 2

An aluminum nitride substrate was prepared in the same manner as in Example 1, except that the composition of the paste (A) (electrically conductive paste for forming via hole) was changed as shown in Table 2. Various properties of the aluminum nitride substrate were measured. The results are set forth in Table 3.

Examples 4 and 5, Comparative Example 3

An aluminum nitride substrate was prepared in the same manner as in Example 1, except that the composition of the paste (B) (electrically conductive paste for forming internal electrically conductive layer) was changed as shown in Table 2. Various properties of the aluminum nitride substrate were measured. The results are set forth in Table 3.

Example 6

The aluminum nitride molded product laminate (i) prepared in Example 1 was dewaxed under heating at 850° C. for 2 hours with passing a dry hydrogen gas at a rate of 12 l/min. The temperature was elevated at a rate of 2.5° C./min. A test sample having been dewaxed under heating at the same time was examined on the carbon residue, and as a result, the carbon residue was 900 ppm. After dewaxing, the dewaxed laminate was sintered in the same manner as in Example 1 to prepare an aluminum nitride substrate. Various properties of the aluminum nitride substrate were measured. The results are set forth in Table 3.

Example 7

The aluminum nitride molded product laminate (i) prepared in Example 1 was dewaxed under heating at 900° C. for 2 hours with passing a dry nitrogen gas at a rate of 20 l/min. The temperature was elevated at a rate of 2.5° C./min. A test sample having been dewaxed under heating at the same time was examined on the carbon residue, and as a result, the carbon residue was 2800 ppm. After dewaxing, the dewaxed laminate was sintered in the same manner as in Example 1 to prepare an aluminum nitride substrate. Various properties of the aluminum nitride substrate were measured. The results are set forth in Table 3.

Comparative Example 4

The aluminum nitride molded product laminate (i) prepared in Example 1 was dewaxed under heating at 850° C. for 2 hours with passing a moistened hydrogen gas at a rate of 10 l/min. The temperature was elevated at a rate of 2.5° C./min. A test sample having been dewaxed under heating at the same time was examined on the carbon residue, and as a result, the carbon residue was 600 ppm. After dewaxing, the dewaxed laminate was sintered in the same manner as in Example 1 to prepare an aluminum nitride substrate. Various properties of the aluminum nitride substrate were measured. The results are set forth in Table 3.

Comparative Example 5

The aluminum nitride molded product laminate (i) prepared in Example 1 was dewaxed under heating at 900° C. for 2 hours with passing a dry nitrogen gas at a rate of 15 l/min. The temperature was elevated at a rate of 2.5° C./min. A test sample having been dewaxed under heating at the same time was examined on the carbon residue, and as a result, the carbon residue was 3500 ppm. After dewaxing, the dewaxed laminate was sintered in the same manner as in Example 1 to prepare an aluminum nitride substrate. Various properties of the aluminum nitride substrate were measured. The results are set forth in Table 3.

TABLE 2

| | Corresponding sectional view | Carbon residue (ppm) | Amount of AlN added (part(s) by weight) Paste (A) | Amount of AlN added (part(s) by weight) Paste (B) | Concentration of refractory metal (% by weight) Paste (A) | Concentration of refractory metal (% by weight) Paste (B) | Viscosity of paste (poise) Paste (A) | Viscosity of paste (poise) Paste (B) | Firing temperature (° C.) First step | Firing temperature (° C.) Second step |
|---|---|---|---|---|---|---|---|---|---|---|
| Ex. 1 | FIG. 1 | 2430 | 5 | 5 | 90.8 | 79.5 | 2300 | 950 | 1580 | 1870 |
| Ex. 2 | FIG. 1 | 2430 | 3 | 5 | 92.6 | 79.5 | 1980 | 950 | 1580 | 1870 |
| Ex. 3 | FIG. 1 | 2430 | 9 | 5 | 87.5 | 79.5 | 2140 | 950 | 1580 | 1870 |

TABLE 2-continued

|  | Corresponding sectional view | Carbon residue (ppm) | Amount of AlN added (part(s) by weight) Paste (A) | Amount of AlN added (part(s) by weight) Paste (B) | Concentration of refractory metal (% by weight) Paste (A) | Concentration of refractory metal (% by weight) Paste (B) | Viscosity of paste (poise) Paste (A) | Viscosity of paste (poise) Paste (B) | Firing temperature (° C.) First step | Firing temperature (° C.) Second step |
|---|---|---|---|---|---|---|---|---|---|---|
| Comp. Ex. 1 | FIG. 1 | 2430 | 0 | 5 | 96.5 | 79.5 | 3500 | 950 | 1580 | 1870 |
| Comp. Ex. 2 | FIG. 1 | 2430 | 13 | 5 | 82.5 | 79.5 | 4710 | 950 | 1580 | 1870 |
| Ex. 4 | FIG. 1 | 2200 | 5 | 12 | 90.8 | 71.3 | 2300 | 1000 | 1580 | 1870 |
| Ex. 5 | FIG. 1 | 2010 | 5 | 18 | 90.8 | 65.7 | 2300 | 1030 | 1580 | 1870 |
| Comp. Ex. 3 | FIG. 1 | 2530 | 5 | 0 | 90.8 | 84.7 | 2300 | 770 | 1580 | 1870 |
| Ex. 6 | FIG. 1 | 900 | 5 | 5 | 90.8 | 79.5 | 2300 | 950 | 1580 | 1870 |
| Ex. 7 | FIG. 1 | 2800 | 5 | 5 | 90.8 | 79.5 | 2300 | 950 | 1580 | 1870 |
| Comp. Ex. 4 | FIG. 1 | 600 | 5 | 5 | 90.8 | 79.5 | 2300 | 950 | 1580 | 1870 |
| Comp. Ex. 5 | FIG. 1 | 3500 | 5 | 5 | 90.8 | 79.5 | 2300 | 950 | 1580 | 1870 |

TABLE 3

|  | Appearance of sintering product | Warpage of sintering product (μm) | Thermal conductivity of sintering product (W/mK) | Internal electrically conductive layer/AlN Adhesion strength (kg/mm²) | Internal electrically conductive layer/AlN Peeling mode | Electrically conductive via hole/AlN Adhesion strength (kg/mm²) | Electrically conductive via hole/AlN Peeling mode | Electrical resistance of via hole (mΩ) |
|---|---|---|---|---|---|---|---|---|
| Ex. 1 | good | 50 | 215 | 16.4 | in solder | 13.4 | in solder | 8.0/8.1 |
| Ex. 2 | good | 52 | 211 | 16.3 | in solder | 12.2 | in solder | 4.2/4.3 |
| Ex. 3 | good | 49 | 209 | 16.1 | in solder | 16.3 | in solder | 15.8/15.9 |
| Comp. Ex. 1 | bad | 50 | 205 | 3.1 | W/AlN | 1.7 | W/AlN | 4.0/4.1 |
| Comp. Ex. 2 | bad | 48 | 207 | 2.2 | W/AlN | 2.4 | W/AlN | 54.4/55.0 |
| Ex. 4 | good | 65 | 212 | 17.0 | in solder | 13.1 | in solder | 7.2/7.3 |
| Ex. 5 | good | 78 | 208 | 17.1 | in solder | 12.8 | in solder | 6.5/6.6 |
| Comp. Ex. 3 | bad | 47 | 217 | 1.7 | W/AlN | 5.2 | in solder | 8.3/8.4 |
| Ex. 6 | good | 18 | 197 | 13.5 | in solder | 10.8 | in solder | 5.2/5.3 |
| Ex. 7 | good | 72 | 218 | 15.6 | in solder | 12.8 | in solder | 15.7/16.0 |
| Comp. Ex. 4 | good | 15 | 162 | 8.2 | W/AlN | 6.2 | W/AlN | 4.5/4.8 |
| Comp. Ex. 5 | bad | 262 | 195 | 3.3 | W/AlN | 2.4 | W/AlN | 46.0/47.5 |

Examples 8–11, Comparative Examples 6–9

An aluminum nitride substrate was prepared in the same manner as in Example 1, except that the firing conditions of the aluminum nitride molded product laminate (i) were changed as shown in Table 4. Various properties of the aluminum nitride substrate were measured. The results are set forth in Table 5.

Example 12

The aluminum nitride green sheet prepared in Example 1 was cut into a size of 65×65 mm. The aluminum nitride green sheet was laminated on an electrically conductive paste layer side surface of an aluminum nitride molded product (I) prepared in the same manner as in Example 1. The laminating pressure was 80 kgf/cm², the laminating temperature was 75° C., and the laminating time was 15 minutes.

The resulting aluminum nitride molded product laminate (ii) was dewaxed under heating under the same conditions as in Example 1. A test sample having been dewaxed at the same time was examined on the carbon residue, and as a result, the carbon residue was 2030 ppm. After dewaxing, the dewaxed laminate was placed in an aluminum nitride container and sintered under the same conditions as in Example 1.

Figure 2:
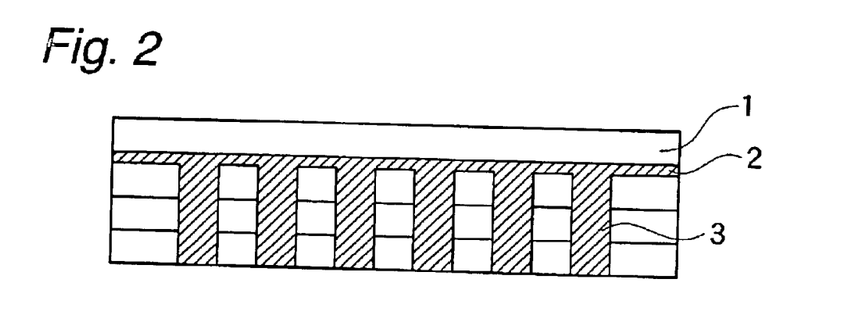
FIGS. 2 to 4 are schematic sectional views of substrates, in other embodiments, according to the present invention.
Figure 3:
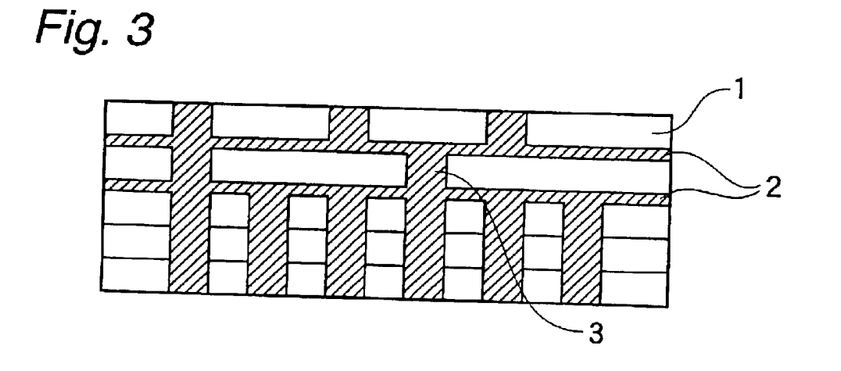

The resulting aluminum nitride substrate having a structure shown in the sectional view of FIG. 2 was measured on various properties. The results are set forth in Table 5.

Example 13

On one surface of the aluminum nitride molded product laminate (i) having been prepared in Example 1 and having via hole-forming holes filled with the paste (A) and inside an electrically conductive paste layer, the paste (B) was printed by screen printing to form a whole surface solid pattern. The printed film thickness was 18 μm.

Separately, another aluminum nitride green sheet cut into 65×65 mm was punched by a punching metal mold having a diameter of 0.28 mm maintaining a pitch of 1.0 mm in order to form through holes arranged in a number of 60×60. The through holes were filled with the paste (A) by the pressurized penetration method to prepare an aluminum nitride molded product (III). The filling pressure was 55 psi, and the filling time was 150 seconds.

Then, the aluminum nitride molded product (III) was laminated on the electrically conductive paste layer side surface of the aluminum nitride molded product laminate (i). The laminating pressure was 85 kgf/cm², the laminating temperature was 70° C., and the laminating time was 15 minutes.

Thus, an aluminum nitride molded product laminate (iii) having inside two electrically conductive paste layers was prepared. The aluminum nitride molded product laminate (iii) was dewaxed under heating under the same conditions as in Example 1. A test sample having been dewaxed under heating at the same time was examined on the carbon residue, and as a result, the carbon residue was 2890 ppm. After dewaxing, the dewaxed laminate was placed in an aluminum nitride container and sintered under the same conditions as in Example 1. Thus, an aluminum nitride substrate having a thickness of 1.5 mm and a structure shown in the sectional view of FIG. 3 was prepared.

Various properties of the aluminum nitride substrate obtained were measured. The results are set forth in Table 5.

Example 14

Figure 4:
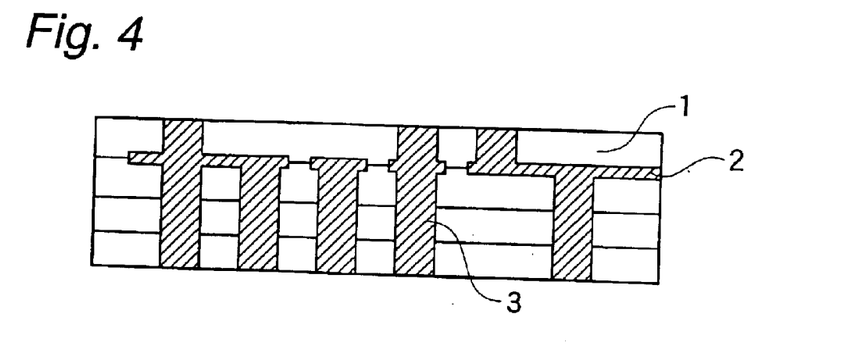

An aluminum nitride substrate having a structure shown in the sectional view of FIG. 4 was prepared in the same manner as in Example 1, except that the whole surface solid pattern formed on one surface of the aluminum nitride molded product (I) by screen printing of the paste (B) was changed to a circuit pattern, and the number and the positions of the through holes to be formed in the aluminum nitride molded product (II) were changed to those corresponding to the above circuit pattern.

Various properties of the aluminum nitride substrate obtained were measured. The results are set forth in Table 5.

Then, the aluminum nitride substrate was polished like a mirror surface so that the surface coarseness Ra became 0.02 µm, and then the substrate was slit from the upper surface of the substrate to the depth of 0.15 mm under the conditions of a width of 1.2 mm and a pitch of 4.2 mm to give a shape having a convex section. The resulting substrate was then cut into a chip having a width of 2.0 mm and a length of 4.0 mm.

Figure 5:
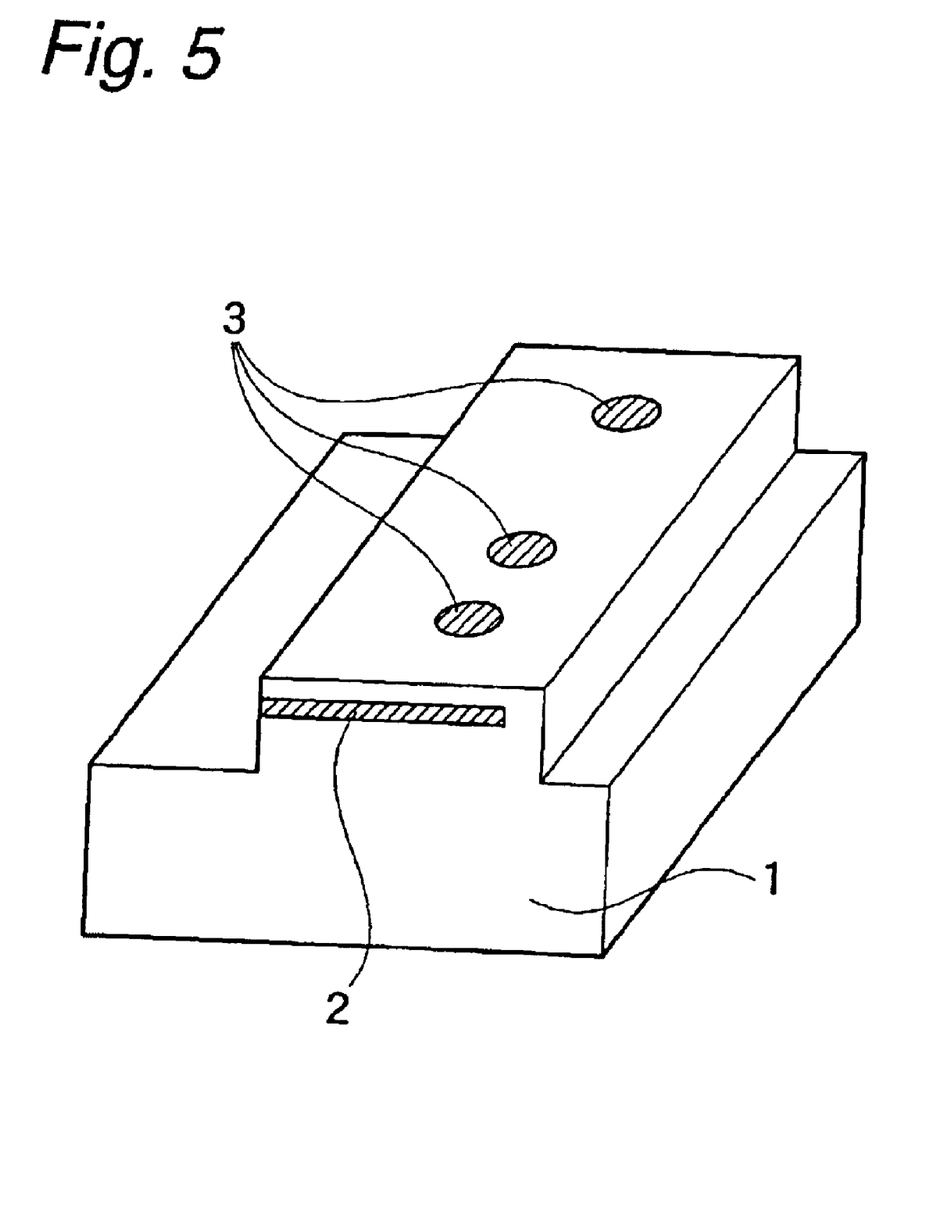
FIG. 5 is a schematic perspective view of a substrate, in another embodiment, according to the present invention.

Thus, there was prepared such a substrate of convex shape as shown in the perspective view of FIG. 5 wherein the internal electrically conductive layer was formed as a circuit pattern having an average line width of 0.1 mm and a minimum line width of 0.080 mm, the proportion of the internal electrically conductive layer to the horizontal section of the substrate was 68%, and six via holes penetrating from the upper surface of the convex portion from the lower surface of the base portion were formed.

TABLE 4

|  | Corresponding sectional view | Carbon residue (ppm) | Amount of AlN added (part(s) by weight) Paste (A) | Paste (B) | Firing temperature (° C.) First step | Firing temperature (° C.) Second step |
|---|---|---|---|---|---|---|
| Ex. 8 | FIG. 1 | 2430 | 5 | 5 | 1250 | 1870 |
| Ex. 9 | FIG. 1 | 2430 | 5 | 5 | 1650 | 1870 |
| Ex. 10 | FIG. 1 | 2430 | 5 | 5 | 1580 | 1820 |
| Ex. 11 | FIG. 1 | 2430 | 5 | 5 | 1580 | 1930 |
| Comp. Ex. 6 | FIG. 1 | 2430 | 5 | 5 | 1100 | 1870 |
| Comp. Ex. 7 | FIG. 1 | 2430 | 5 | 5 | 1800 | 1870 |
| Comp. Ex. 8 | FIG. 1 | 2430 | 5 | 5 | 1580 | 1750 |
| Comp. Ex. 9 | FIG. 1 | 2430 | 5 | 5 | 1580 | 2000 |
| Ex. 12 | FIG. 2 | 2030 | 5 | 5 | 1580 | 1870 |
| Ex. 13 | FIG. 3 | 2890 | 5 | 5 | 1580 | 1870 |
| Ex. 14 | FIG. 4 | 1870 | 5 | 5 | 1580 | 1870 |

TABLE 5

|  | Appearance of sintering product | Warpage of sintering product (µm) | Thermal conductivity of sintering product (W/mK) | Internal electrically conductive layer/AlN Adhesion strength (kg/mm²) | peeling mode | Electrically conductive via hole/AlN Adhesion strength (kg/mm²) | peeling mode | Electrical resistance of via hole (mΩ) |
|---|---|---|---|---|---|---|---|---|
| Ex. 8 | good | 48 | 209 | 16.2 | in solder | 13.2 | in solder | 18.5/18.7 |
| Ex. 9 | good | 50 | 211 | 16.4 | in solder | 13.4 | in solder | 8.1/8.1 |
| Ex. 10 | good | 42 | 207 | 16.1 | in solder | 13.5 | in solder | 9.0/9.1 |
| Ex. 11 | good | 60 | 220 | 16.2 | in solder | 12.0 | in solder | 6.3/6.4 |
| Comp. Ex. 6 | good | 49 | 170 | 10.4 | in solder | 8.5 | in solder | 65.0/68.0 |
| Comp. Ex. 7 | good | 44 | 171 | 13.2 | in solder | 10.8 | in solder | 16.0/16.5 |

TABLE 5-continued

|  | Appearance of sintering product | Warpage of sintering product (μm) | Thermal conductivity of sintering product (W/mK) | Internal electrically conductive layer/AlN | | Electrically conductive via hole/AlN | | Electrical resistance of via hole (mΩ) |
|---|---|---|---|---|---|---|---|---|
|  |  |  |  | Adhesion strength (kg/mm²) | peeling mode | Adhesion strength (kg/mm²) | peeling mode |  |
| Comp. Ex. 8 | bad | 45 | 153 | 7.9 | in solder | 6.5 | W/AlN | 12.0/13.5 |
| Comp. Ex. 9 | bad | 287 | 205 | 2.4 | W/AlN | 2.0 | W/AlN | 21.0/21.3 |
| Ex. 12 | good | 42 | 210 | 16.9 | in solder | 13.1 | in solder | —/6.3 |
| Ex. 13 | good | 87 | 219 | 15.9/15.1 | in solder | 13.8 | in solder | 15.8/15.6/16.0 |
| Ex. 14 | good | 27 | 215 | 15.2 | in solder | 13.3 | in solder | 6.0/6.1 |

Examples 15–21, Comparative Examples 10–14

An electrically conductive pattern was formed on each surface of the substrate obtained in each of Examples 1 to 7 and Comparative Examples 1 to 5 in the following manner to obtain a metallized substrate.

In the first place, the surface of the substrate was ground by the use of diamond abrasive grains until the substrate thickness became 1.2 mm and the sintering product had a mirror surface. For the grinding, the side end of the internal electrically conductive layer was exposed outside on the side surface of the substrate, and the grinding was carried out so that the distance between the side end of the internal electrically conductive layer and the substrate surface became 0.2 mm. The centerline average coarseness (Ra) on the surface of the resulting substrate was measured by a Surfcom 550A manufactured by Tokyo Seimitsu K.K., and as a result, Ra was 0.02 μm.

The thus treated substrate was subjected to ultrasonic cleaning in methylene chloride, then dried in vapor of methylene chloride and subjected to sputtering to form metallic thin films (first layer/second layer/third layer=Ti: 0.1 μm/Pt: 0.2 μm/Au: 0.5 μm) all over the front and back surfaces of the substrate. After formation of the metallic thin films, the metallic thin films on the front and the back surfaces were subjected to dry etching to form electrically conductive patterns.

In the next place, a Ta—N thin film having a thickness of 0.1 μm was formed all over the front surface of the substrate including the electrically conductive pattern by a reactive sputtering method. The Ta—N thin film was analyzed by a fully automatic X-ray diffraction apparatus manufactured by Nippon Philips K.K., and as a result, a diffraction peak of a $Ta_2N$ phase was observed. After the formation of the Ta—N thin film, an unnecessary portion of the Ta—N thin film was removed by a wet etching method to form a resistor thin film pattern. After the formation of the resistor thin film layer, the substrate was heated in the open air at 360° C. for 4 hours to perform a resistance stabilizing treatment.

The resulting metallized substrate was cut into a chip by a dicing machine to obtain a metallized substrate.

Various properties of the metallized substrate obtained were measured. The results are set forth in Table 6.

TABLE 6

| Substrate | Appearance of metallized substrate | Electrical resistance between electrically conductive pattern and via hole (mΩ) |
|---|---|---|
| Ex. 1 | good | 48.0/48.6 |
| Ex. 2 | good | 25.6/26.1 |
| Ex. 3 | good | 78.2/79.2 |
| Comp. Ex. 1 | bad | 24.0/24.6 |
| Comp. Ex. 2 | bad | 321/330 |
| Ex. 4 | good | 43.8/44.6 |
| Ex. 5 | good | 38.2/37.2 |
| Comp. Ex. 3 | bad | 51.2/53.4 |
| Ex. 6 | good | 30.8/31.3 |
| Ex. 7 | good | 82.4/83.1 |
| Comp. Ex. 4 | good | 28.2/28.8 |
| Comp. Ex. 5 | bad | 277/291 |

What is claimed is:

1. A substrate formed from an aluminum nitride sintering product having an internal electrically conductive layer, at least one electrically conductive via hole formed between the internal electrically conductive layer and at least one surface of the substrate, wherein:

the thermal conductivity of the aluminum nitride sintering product at 25° C. is 190 W/mK or more, and We adhesion strength between the aluminum nitride sintering product and the internal electrically conductive layer is 5.0 kg/mm² or more.

2. The substrate as claimed in claim 1, wherein the adhesion strength between the aluminum nitride sintering product end the electrically conductive via hole is 5.0 kg/mm² or more.

3. The substrate as claimed in claim 1, wherein the electrically conductive via hole comprises a sintering product of an electrically conductive paste having a refractory metal concentration of 85 to 95% by weight, and the internal electrically conductive layer comprises a sintering product of an electrically conductive paste having a refractory metal concentration of 65 to 83% by weight.

4. A metallized substrate having an electrically conductive pattern formed on at least one surface of both surfaces of the substrate of claim 1, wherein at least a part of the electrically conductive pattern is electrically connected to the electrically conductive via hole.

5. The substrate as claimed in claim 2, wherein the electrically conductive via hole comprises a sintering product of an electrically conductive paste having a refractory metal concentration of 85 to 95% by weight, arid the internal electrically conductive layer comprises a sintering product of an electrically conductive paste having a refractory metal concentration of 65 to 83% by weight.

6. A metallized substrate having an electrically conductive pattern formed on at least one surface of both surfaces of the substrate of claim 2, wherein at least a part of the electrically conductive pattern is electrically connected to the electrically conductive via bole.

7. A metallized substrate having an electrically conductive pattern formed on at least one surface of both surfaces of the substrate of claim 3, wherein at least a part of the electrically conductive pattern is electrically connected to the electrically conductive via hole.

8. A substrate formed an aluminum nitride sintering product having an internal electrically conductive layer, having at least one electrically conductive via hole formed between the internal electrically conductive layer and at least one surface of the substrate, wherein the thermal conductivity of the aluminum nitride sintering product at 25° C. is 190 W/mK or more, and the adhesion strength between the aluminum nitride sintering product and the internal electrically conductive layer is 5.0 kg/mm$^2$ or more, wherein the substrate is produced by a process comprising:

forming at least one via hole-forming through hole in a first aluminum nitride molded product comprising an aluminum nitride powder, a sintering aid and an organic binder, filling the through hole with an electrically conductive paste (A) comprising 100 parts by weight of a refractory metal powder and 2 to 10 parts by weight of an aluminum nitride powder, coating the surface of the first aluminum nitride molded product with an electrically conductive caste (B) comprising 100 parts by weight of a refractory metal powder and 2 to 20 parts by weight of an aluminum nitride powder to form an electrically conductive paste layer.

laminating a second aluminum nitride molded product comprising an aluminum nitride powder, a sintering aid and an organic binder on the first aluminum nitride molded product through the layer of the electrically conductive caste (B), and dewaxing the resulting aluminum nitride molded product laminate so that the carbon residue becomes 800 to 3000 ppm, then firing the laminate at a temperature of 1200 to 1700° C. and further firing the laminate at a temperature of 1800 to 1950° C.

9. The substrate of claim 8, wherein the concentration of the refractory metal in the electrically conductive paste (A) with which the via hole-forming through hole of the first aluminum nitride molded product is to be filled is in the range of 85 to 95% by weight, and the concentration of the refractory metal in the electrically conductive paste (B) with which the surface of the first aluminum nitride molded product is to be coated is in the range of 65 to 83% by weight.

10. The substrate of claim 9, wherein the viscosity of the electrically conductive paste (A) with which the via hole-forming through hole of the first aluminum nitride molded product is to be filled is in the range of 100 to 30000 poise at 25° C./5 rpm, and the viscosity of the electrically conductive paste (B) with which the surface of the first aluminum nitride molded product is to be coated is in the range of 800 to 1200 poise at 35° C./5 rpm.

* * * * *

UNITED STATES PATENT AND TRADEMARK OFFICE
CERTIFICATE OF CORRECTION

PATENT NO. : 6,762,496 B2
DATED : July 13, 2004
INVENTOR(S) : Yamamota et al.

It is certified that error appears in the above-identified patent and that said Letters Patent is hereby corrected as shown below:

Column 26,
Lines 47-48, "We adhesion strength" should read -- the adhesion strength --

Column 27,
Line 2, "arid the internal" should read -- and the internal --
Line 16, "formed an" should read -- formed from an --

Column 28,
Line 2, "conductive caste" should read -- conductive paste --
Lines 5-6, "paste layer." should read -- paste layer, --
Line 11, "conductive caste" should read -- conductive paste --

Signed and Sealed this

Twenty-first Day of December, 2004

JON W. DUDAS
*Director of the United States Patent and Trademark Office*